United States Patent
Dakshina-Murthy (10) Patent No.: US 7,186,650 B1
(45) Date of Patent: Mar. 6, 2007

(54) CONTROL OF BOTTOM DIMENSION OF TAPERED CONTACT VIA VARIATION(S) OF ETCH PROCESS

(75) Inventor: Srikanteswara Dakshina-Murthy, Wappingers Falls, NY (US)

(73) Assignee: Advanced Micro Devices, Inc., Austin, TX (US)

( * ) Notice: Subject to any disclaimer, the term of this patent is extended or adjusted under 35 U.S.C. 154(b) by 270 days.

(21) Appl. No.: 10/909,509

(22) Filed: Aug. 2, 2004

(51) Int. Cl.
  *H01L 21/66* (2006.01)
  *H01L 21/302* (2006.01)
  *H01L 21/461* (2006.01)
  *H01L 21/311* (2006.01)

(52) U.S. Cl. .................. 438/689; 438/14; 438/701; 438/714

(58) Field of Classification Search .............. 438/629, 438/700, 714, 701, 689, 16, 14
See application file for complete search history.

(56) References Cited

U.S. PATENT DOCUMENTS

| | | |
|---|---|---|
| 6,431,182 B1 | 8/2002 | Rakhshandehroo et al. |
| 6,521,524 B1 | 2/2003 | Wang et al. |
| 6,555,479 B1 | 4/2003 | Hause et al. |
| 6,686,270 B1 * | 2/2004 | Subramanian et al. ...... 438/629 |
| 6,767,827 B1 | 7/2004 | Okada et al. |
| 6,949,203 B2 * | 9/2005 | Hsieh et al. .................. 216/67 |

* cited by examiner

*Primary Examiner*—Chuong Anh Luu
(74) *Attorney, Agent, or Firm*—Amin, Turocy & Calvin, LLP (57) ABSTRACT

Systems and methods are described for controlling critical dimension (CD) variation at the bottom of a tapered contact via on a semiconductor substrate. The invention monitors contact vias on a wafer to detect variations in CD at the top of the via in order to facilitate selective alteration of etching component ratios in an etching process, which permits adjustment of the slope of the tapered contact vias. In this manner, the invention compensates for top CD variations to maintain desired CD at the bottom of tapered vias within a target tolerance on subsequent wafers in a wafer fabrication environment.

14 Claims, 11 Drawing Sheets

CONTROL OF BOTTOM DIMENSION OF TAPERED CONTACT VIA VARIATION(S) OF ETCH PROCESS

TECHNICAL FIELD

The present invention relates generally to semiconductor fabrication, and more particularly to systems and methodologies to facilitate control of bottom critical dimension in tapered contacts.

BACKGROUND OF THE INVENTION

In the semiconductor industry, there is a continuing trend toward higher device densities. To achieve these high device densities there have been, and continue to be, efforts toward scaling down device dimensions (e.g., at sub-micron levels) on semiconductor wafers. In order to accomplish such densities, smaller feature sizes and more precise feature shapes are required. This may include width and spacing of interconnecting lines, spacing and diameter of contact holes, and surface geometry, such as corners and edges, of various features. The dimensions of and between such small features can be referred to as critical dimensions (CDs). Reducing CDs and reproducing more accurate CDs facilitates achieving higher device densities.

As semiconductor trends continue toward decreased size and increased packaging density, every aspect of semiconductor fabrication processes is scrutinized in an attempt to maximize efficiency in semiconductor fabrication and throughput. Many factors contribute to fabrication of a semiconductor. For example, at least one photolithographic process can be used during fabrication of a semiconductor. This particular factor in the fabrication process is highly scrutinized by the semiconductor industry in order to improve packaging density and precision in semiconductor structure.

Lithography is a process in semiconductor fabrication that generally relates to transfer of patterns between media. More specifically, lithography refers to a transfer of patterns onto a thin film that has been deposited onto a substrate. The transferred patterns then act as a blueprint for desired circuit components. Typically, various patterns are transferred to a photoresist (e.g., radiation-sensitive film), which overlies the thin film on the substrate during an imaging process described as "exposure" of the photoresist layer. During exposure, the photoresist is subjected to an illumination source (e.g. UV-light, electron beam, X-ray), which passes through a pattern template, or reticle, to print the desired pattern in the photoresist. Upon exposure to the illumination source, radiation-sensitive qualities of the photoresist permits a chemical transformation in exposed areas of the photoresist, which in turn alters the solubility of the photoresist in exposed areas relative to that of unexposed areas. When a particular solvent developer is applied, exposed areas of the photoresist are dissolved and removed, resulting in a three-dimensional pattern in the photoresist layer. This pattern is at least a portion of the semiconductor device that contributes to final function and structure of the device, or wafer.

Techniques, equipment and monitoring systems have concentrated on preventing and/or decreasing defect occurrence within lithography processes. For example, aspects of resist processes that are typically monitored can comprise: whether the correct mask has been used; whether resist film qualities are acceptable (e.g., whether resist is free from contamination, scratches, bubbles, striations, . . . ); whether image quality is adequate (e.g., good edge definition, line-width uniformity, and/or indications of bridging); whether defect types and densities are recorded; and/or whether registration is within specified limits; etc.

Photoresist integrity must be maintained throughout the lithography process because any flaw or structural defect present on a patterned photoresist can be indelibly transferred to underlying layers during subsequent etch process(es) wherein the photoresist is employed.

SUMMARY OF THE INVENTION

The following presents a simplified summary of the invention in order to provide a basic understanding of some aspects of the invention. This summary is not an extensive overview of the invention. It is not intended to identify key/critical elements of the invention or to delineate the scope of the invention. Its sole purpose is to present some concepts of the invention in a simplified form as a prelude to the more detailed description that is presented later.

The present invention provides for systems and methods that facilitate control of bottom critical dimension (CD) of a tapered contact via. Specifically, the invention contemplates manipulation of etch process(es) to compensate for variations in post-development inspection CD (DICD) at the top of a contact via. By accounting for DICD variation via manipulation of etch process(es), bottom CD can be controlled in tapered vias, such as are utilized, for example, in high aspect ratio self-aligned processes.

An aspect of the invention provides for employing a monitoring component, such as, for example, a scatterometry component, to provide a real-time profile of tapered contact holes on a wafer. A control component can process information associated with variations in DICD and initiate compensatory action. For example, amount(s) of etching components can be varied as etching proceeds in order to vary the degree of taper from top to bottom of the via, such that bottom CD of subsequent vias can be maintained within a desired target tolerance despite variances in CD at the top of the tapered contact hole.

According to another aspect of the invention, feedback/feed-forward data can be generated and loops can be created to facilitate efficient communication between a monitoring component and an etcher. Such feedback can be employed to adjust etcher parameters for subsequent wafers in order to ensure that bottom CD is within target tolerances. For example, ratios of etchant gases can be varied to compensate for top CD so that bottom CD is maintained within a desired tolerance.

To the accomplishment of the foregoing and related ends, certain illustrative aspects of the invention are described herein in connection with the following description and the annexed drawings. These aspects are indicative, however, of but a few of the various ways in which the principles of the invention can be employed and the present invention is intended to include all such aspects and their equivalents. Other advantages and novel features of the invention will become apparent from the following detailed description of the invention when considered in conjunction with the drawings.

DETAILED DESCRIPTION OF THE INVENTION

The present invention will now be described with reference to the drawings, wherein like reference numerals are used to refer to like elements throughout. The present invention will be described with reference to systems and methods for providing a simple control approach that can account for DICD variation in order to maintain control of bottom CD in a tapered contact hole. It should be understood that the description of these exemplary aspects are merely illustrative and that they should not be taken in a limiting sense.

The term "component" can refer to a computer-related entity, either hardware, a combination of hardware and software, software, or software in execution. For example, a component can be a process running on a processor, a processor, an object, an executable, a thread of execution, a program and a computer. By way of illustration, both an application running on a server and the server can be components. A component can reside in one physical location (e.g., in one computer) and/or can be distributed between two or more cooperating locations (e.g., parallel processing computer, computer network).

It is to be appreciated that various aspects of the present invention can employ technologies associated with facilitating unconstrained optimization and/or minimization of error costs. Thus, non-linear training systems/methodologies (e.g., back propagation, Bayesian, fuzzy sets, non-linear regression, or other neural networking paradigms including mixture of experts, cerebella model arithmetic computer (CMACS), radial basis functions, directed search networks, and function link networks) can be employed.

Tapered contacts are often used for high-aspect ratio self-aligned processes. One example of an undesirable structural defect associate with tapered contacts is varied bottom CD. Varied bottom CD refers to an occurrence wherein bottom CD is not within a target tolerance with respect to variations in DICD. Current methods of tapered contact formation typically cannot account for conditions that result in varied bottom CD. As lithographic techniques are pushed to their limits, smaller and smaller CDs are desired to maximize chip performance. Thus, chip manufacture is governed largely by wafer CD, which is defined as the smallest allowable width of, or space between, lines of circuitry in a semiconductor device. The pitch or spacing between adjacent pairs of lines or holes (contacts) is another factor that limits the packing density of circuitry on the chip. The pitch is essentially limited by the wavelength of light and the mask used in the photolithographic process, and cannot generally be influenced after the photolithography process, unlike the wafer CD. As methods of wafer manufacture are improved, wafer CD is decreased, which in turn requires ever smaller contacts to be produced. Because CD can vary substantially at the top of a contact, utilization of a fixed taper can result in varied bottom CD in the contact, which in turn can detrimentally affect the performance of the finished product. Thus, there exists a need in the art for systems and methods that can facilitate control of bottom CD in a tapered contact.

As used herein, the phrase "slope of the taper" is inversely related to "taper" itself. For example, if the slope of the taper increases (e.g., becomes more steep), then the taper, by definition, decreases. This is so because "taper" is defined as the difference between the width of the top of the contact hole and the width of the bottom of the contact hole. Thus, if slope increases, then the difference between the two widths is reduced.

Figure 1:
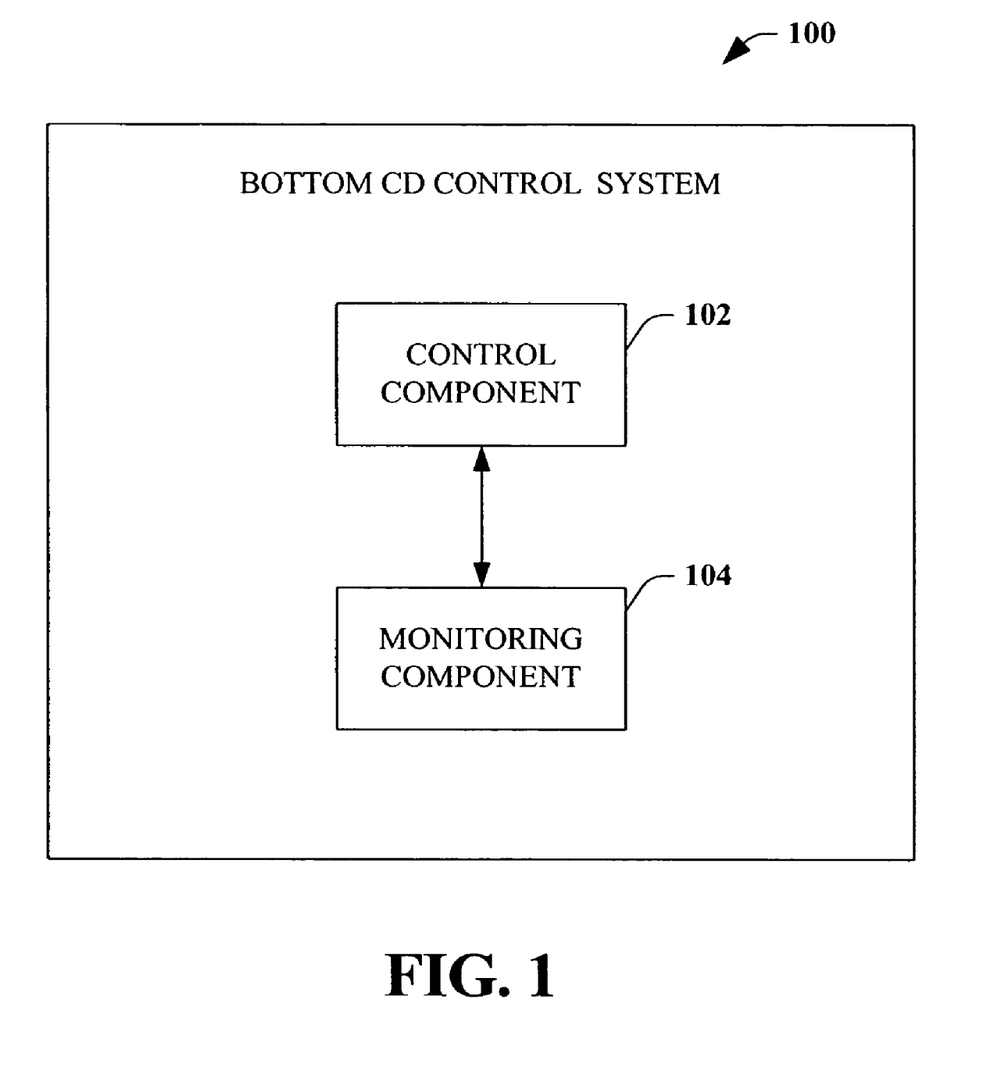
FIG. 1 is an illustration of a system for controlling bottom CD in high-aspect ratio tapered contact vias.

FIG. 1 is an illustration of a bottom CD control system 100 according to an aspect of the present invention, in which a control component 102 is operatively coupled to a monitoring component 104. The control component 102 can receive information from the monitoring component 104 regarding real-time status of tapered contact vias on a semiconductor wafer, such as, for example, high-density flash memory. Tapered contact vias are necessitated by the high density of contact lines employed in flash memory. This allows the formation of larger holes/vias in the photolithography step than required at the actual circuitry contact at the bottom. This also helps to significantly increase the process margin—and thereby product yield—by reducing the probability of contact scumming/incomplete open during lithography.

Employing a fixed taper can result in a lack of uniformity of bottom CD in a contact hole. Because contact between circuitry lines occurs via the bottom of the contact hole, bottom CD uniformity is of paramount importance in semiconductor manufacture. The monitoring component 104 can determine the CD of the top of the contact via by measuring post-development critical dimension (DICD). Such information can be received by the control component 102, which can compare the DICD of a tapered contact via to a predetermined tolerance value to determine whether the DICD is within a specified tolerance. If the DICD is determined to be outside of a desired range, the control component 104 can manipulate etchant ratios in order to alter the degree of taper of the via, such that bottom CD can be achieved within a desired tolerance despite variations in DICD at the top of the via. For example, if the DICD of the via is larger than desired, the slope of the taper down to the bottom of the via must be decreased. To decrease the slope of the taper, the ratio of a horizontal etching component to a vertical etching component can be increased.

As used herein, a horizontal etching component is a component in an etching process that will decrease the slope (e.g., alter the slope toward the horizontal x-plane, etc.) of a tapered via if a concentration thereof is increased with respect to other etching components. Similarly, a vertical etching component is a component that will increase the slope (e.g., alter the slope toward the vertical y-plane, etc.) of a tapered via if a concentration thereof is increased with respect to other etching components. For instance, in a $CHF_3$, $CF_4$, Ar process, $CHF_3$ can be increased, or $CF_4$ can be decreased, which will result in a higher ratio of $CHF_3$ to $CF_4$. By increasing the ratio of the horizontal etching component to the vertical etching component, the slope of the taper can be reduced to ensure that the bottom CD of the tapered contact via is within a target tolerance despite the fact that the DICD at the top of the via is larger than desired. In this manner, the invention advantageously mitigates problems associated with employing a fixed taper.

The increased ratio of $CHF_3/CF_4$ contributes to greater polymer formation. The increased polymer is easily sputtered away from the vertical etch front due to the anisotropic ion bombardment in plasma etch, but redeposits on the horizontal/lateral etch front, which thereby reduces the horizontal lateral etch rate in comparison to the lateral etch rate. Hence, taper is increased. In such etch processes the vertical etch rate is not significantly influenced, since the ions easily sputter away the blocking polymer. The main knob is the relative increase/decrease of the horizontal etch rate, which results in straighter/more tapered profiles.

It is to be appreciated that the monitoring component 104 can be, for example, a scatterometry component. The present invention contemplates any suitable scatterometry component and/or system, and such systems are intended to fall within the scope of the hereto-appended claims. It is further to be appreciated that the monitoring component 104 utilized by the present invention can be, for example, a Scanning Electron Microscope (SEM), a Critical Dimension Scanning Electron Microscope (CD-SEM), a Field Effect Scanning Electron Microscope (FESEM), an In-Lens FESEM, or a Semi-In-Lens FESEM, depending on the desired magnification and precision. For example, FESEM permits greater levels of magnification and resolution at high or low energy levels by rastering a narrower electron beam over the sample area. FESEM thus permits quality resolution at approximately 1.5 nm. Because FESEM can produce high-quality images at a wide range of accelerating voltages (typically 0.5 kV to 30 kV), it is able to do so without inducing extensive electrical charge in the sample. Furthermore, conventional SEM cannot accurately image an insulating material unless the material is first coated with an electrically conductive material. FESEM mitigates the need to deposit an electrically conductive coating prior to scanning. According to another example, the monitoring component 104 of the present invention can be In-Lens FESEM, which is capable of 0.5 nm resolution at an accelerating voltage of 30 kV, or any other suitable type of scanner, such as Transmission Electron Microscopy (TEM), Atomic Force Microscopy (AFM), Scanning Probe Microscopy (SPM), etc.

It is further to be appreciated that information gathered by the monitoring component 104 can be utilized for generating feedback and/or feed-forward data that can facilitate maintaining critical dimensions that are within acceptable tolerances. The bottom CD control system 100 can additionally employ such data to control components and/or operating parameters associated therewith. For instance, feedback/feed-forward information can be generated from sequence analysis to maintain, increase and/or decrease a rate at which fabrication processes (e.g., etching, rate of etchant ratio adjustment . . . ) progress. Additionally, one or a plurality of sensors can be associated with the bottom CD control system 100 to permit data to be gathered regarding the state of the wafer (e.g., temperature, density, viscosity, material composition, and/or any other suitable information related to the condition of the wafer).

Figure 2:
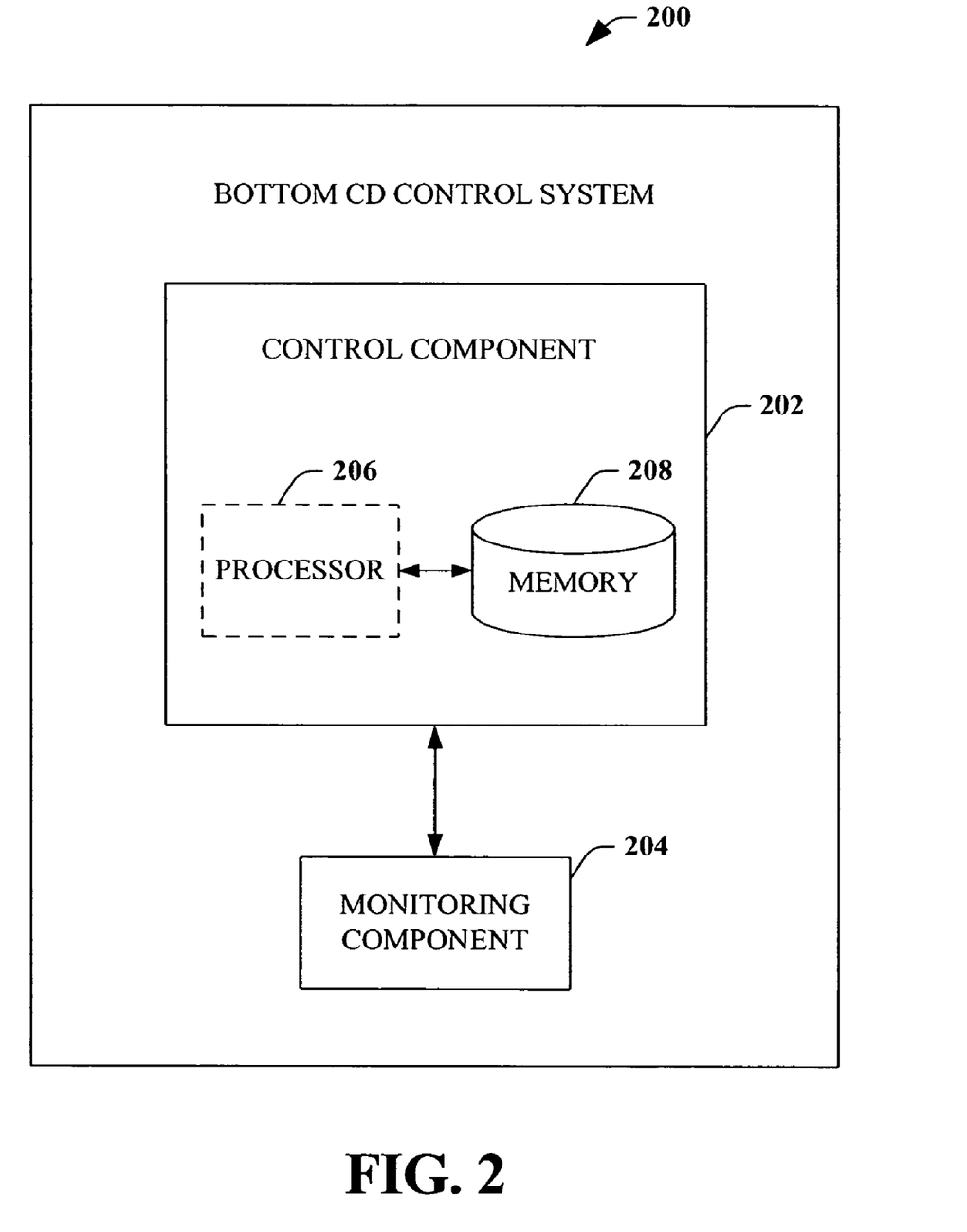
FIG. 2 is an illustration of a system for controlling bottom CD in high-aspect ratio tapered contact vias.

FIG. 2 is an illustration of a bottom CD control system in accordance with an aspect of the invention that comprises a processor 206 and a memory 208. According to the figure, a control component 202 is operably coupled to a monitoring component 204. The control component is further associated with a processor 206 and a memory 208, each of which is further operably coupled to the other.

It is to be understood that a that the processor 206 can be a processor dedicated to accounting for DICD variation and bottom CD control, a processor used to control one or more of the components of the bottom CD control system, or, alternatively, a processor that is both used account for DICD variation and bottom CD control and to control one or more of the components of the bottom CD control system.

The memory component 208 can be employed to retain information associated with, for example, the existence of DICD variation, the degree of DICD variation, tolerances associated with DICD and bottom CD, etc. Furthermore, the memory 208 can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). The memory 208 of the present systems and methods is intended to comprise, without being limited to, these and any other suitable types of memory.

Figure 3:
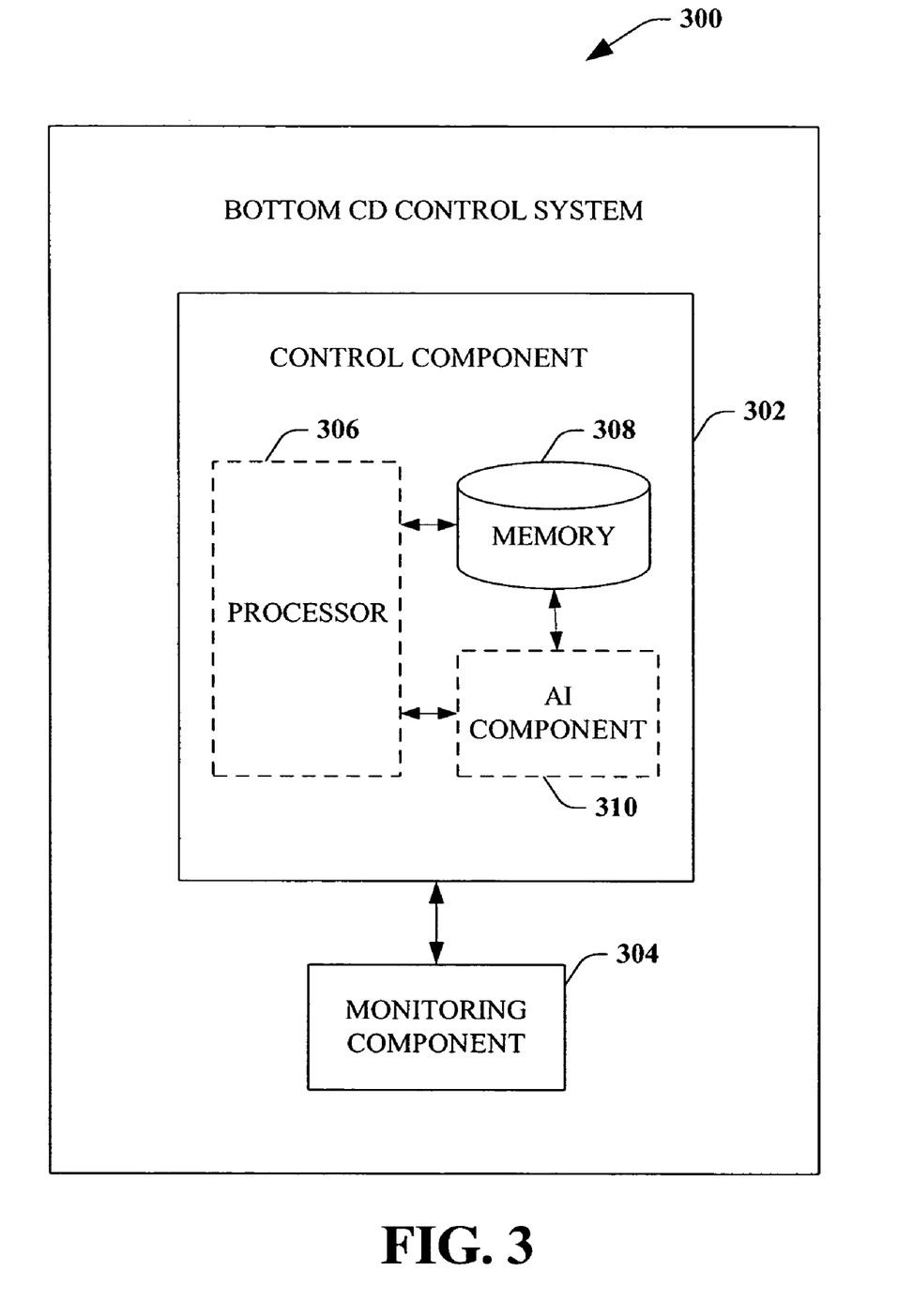
FIG. 3 is an illustration of a system for controlling bottom CD in high-aspect ratio tapered contact vias.

FIG. 3 is an illustration of a system 300 in accordance with an aspect of the present invention. The system 300 can employ various inference schemes and/or techniques in connection with accounting for DICD variation and controlling bottom CD. As used herein, the term "inference" refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources. Various classification schemes and/or systems (e.g., support vector machines, neural networks, expert systems, Bayesian belief networks, fuzzy logic, data fusion engines . . . ) can be employed in connection with performing automatic and/or inferred action in connection with the subject invention.

Still referring to FIG. 3, a control component 302 is operatively coupled to a monitoring component 304. The monitoring component 304 can detect variations in DICD of tapered wafer contact vias after development of the wafer. Associated with the control component are a processor 306, a memory 308, and an AI component 310 that can make inferences regarding whether and to what extent the system should take compensatory action. For example, if DICD is determined to be above a desired target tolerance, the AI component 310 can make inferences regarding whether and to what extent to increase the ratio of horizontal etching component to vertical etching component in order to effect a decrease in the slope of the taper of the via. By decreasing the slope of the taper, the bottom CD will be reduced with respect to the top CD, in such a manner that the bottom CD will be within target tolerance despite the undesirably large top CD. Similarly, if top CD is determined to be smaller than a target tolerance based on information received from the monitoring component 304, the AI component 310 can make inferences regarding whether and/or to what extent to decrease the ratio of horizontal etching component to vertical etching component. Such a decrease in this ratio can effectuate an increase in the taper slope of the via so that bottom CD can be maintained within a target tolerance despite an undesirably small top CD.

Figure 4:
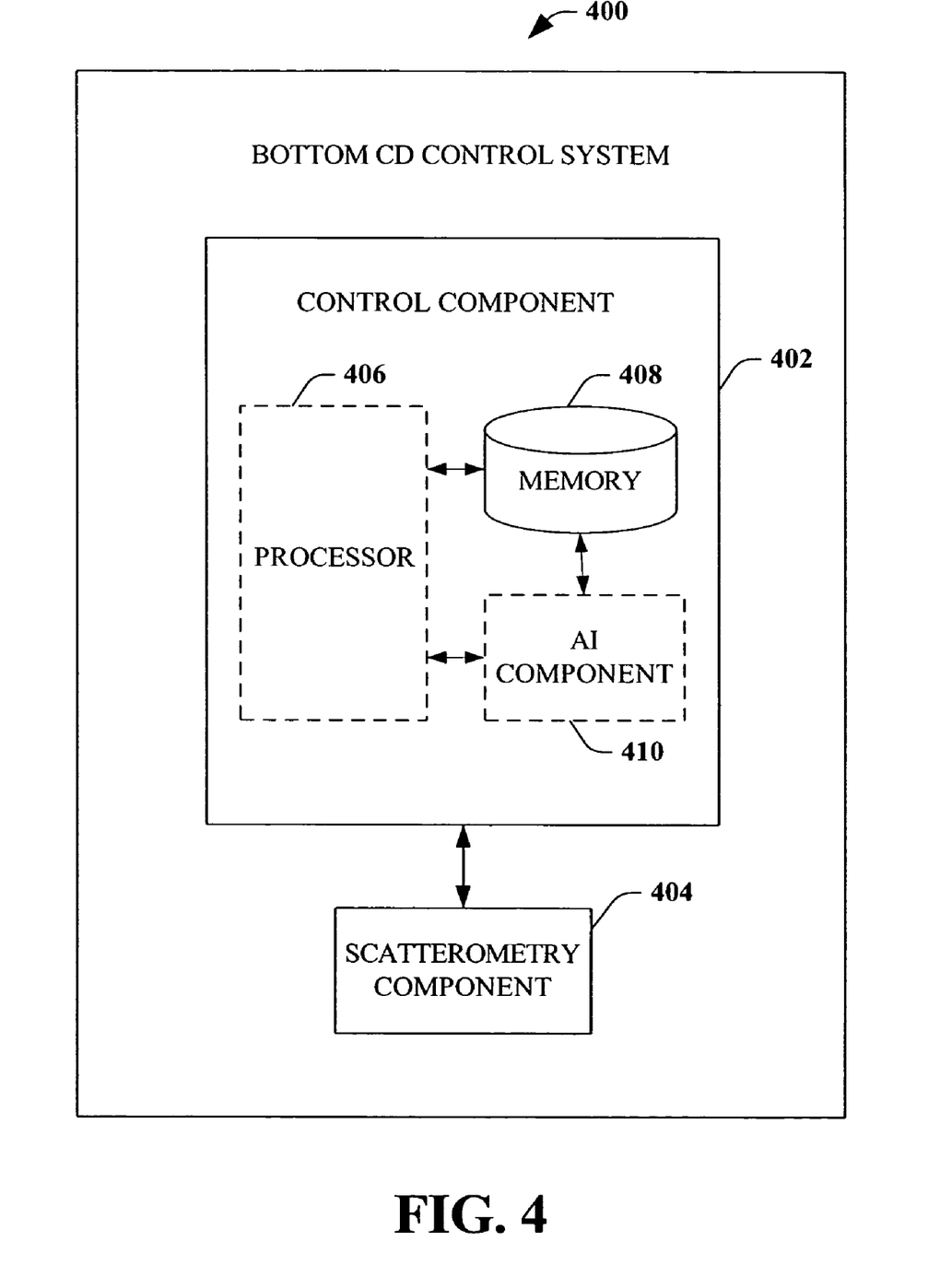
FIG. 4 is an illustration of a system for controlling bottom CD in high-aspect ratio tapered contact vias.

FIG. 4 is an illustration of a bottom CD control system 400 in accordance with an aspect of the invention. A control component 402 is operably coupled to a scatterometry component 404 that can detect variances in top CD of features on a wafer. The control component 402 is operatively associated with a processor 406, and memory 408, and an AI component 410. The scatterometry component is particularly well-adapted to monitor a wafer in conjunction with aspects of the present invention.

Scatterometry is a technique for extracting information about a surface upon which incident light has been directed. Information concerning properties including, but not limited to, dishing, erosion, profile, chemical composition, thickness of thin films and critical dimensions of features present on a surface such as a wafer can be extracted. Furthermore, information about an immersion medium such as refractive index and lithographic constant can be extracted by utilizing scatterometry techniques. The information can be extracted by comparing the phase and/or intensity of the light directed onto the surface with phase and/or intensity signals of a complex reflected and/or diffracted light resulting from the incident light reflecting from and/or diffracting through the surface upon which the incident light was directed. The intensity and/or the phase of the reflected and/or diffracted light will change based on properties of the surface upon which the light is directed. Such properties include, but are not limited to, the chemical properties of the surface, the planarity of the surface, features on the surface, voids in the surface, and the number, type of layers beneath the surface, refractive index of the surface, etc.

Different combinations of the above-mentioned properties will have different effects on the phase and/or intensity of the incident light resulting in substantially unique intensity/phase signatures in the complex reflected and/or diffracted light. Thus, by examining a signal (signature) library of intensity/phase signatures, a determination can be made concerning the properties of the immersion medium utilized in connection with a known grating structure on the surface. Such substantially unique phase/intensity signatures are produced by light reflected from and/or refracted by different surfaces and/or immersion mediums due, at least in part, to the complex index of refraction of the surface onto which the light is directed. The complex index of refraction (N) can be computed by examining the index of refraction (n) of the surface and an extinction coefficient (k). One such computation of the complex index of refraction can be described by the equation:

$$N=n-jk$$

where j is the square root of (−1).

The signal (signature) library can be constructed from observed intensity/phase signatures and/or signatures generated by modeling and simulation. By way of illustration, when exposed to a first incident light of known intensity, wavelength and phase, a first feature on a wafer can generate a first phase/intensity signature. Similarly, when exposed to the first incident light of known intensity, wavelength and phase, a second feature on a wafer or of an immersion medium can generate a second phase/intensity signature. For example, a line of a first width may generate a first signature while a line of a second width may generate a second signature. Observed signatures can be combined with simulated and modeled signatures to form the signal (signature) library. Simulation and modeling can be employed to produce signatures against which measured phase/intensity signatures can be matched. In one exemplary aspect of the present invention, simulation, modeling and observed signatures are stored in a signal (signature) library containing over three hundred thousand phase/intensity signatures. Thus, when the phase/intensity signals are received from scatterometry detecting components, the phase/intensity signals can be pattern matched, for example, to the library of signals, to determine whether the signals correspond to a stored signature. The present invention contemplates any suitable scatterometry component and/or system, and such systems are intended to fall within the scope of the hereto-appended claims.

Figure 5:
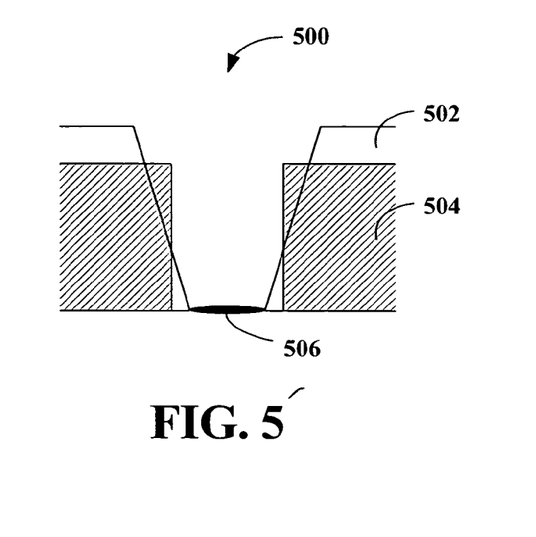
FIG. 5 is an illustration of a tapered contact via exhibiting detrimental DICD variation.

FIG. 5 is a cross-sectional illustration of a tapered contact via 500 that has a top CD above a desired tolerance. A dielectric material 502 has been deposited over a layer of underlying structure 504, which has been deposited on a substrate. Underlying structures include stacked polymers, polysilicon, and the like. Due to the large top CD, the bottom CD 506 is also above a desired tolerance. The above-target bottom CD 506 can detrimentally permit the dielectric material 502 to attach to the underlying polymer, which in turn can adversely affect performance of the finished product. The failure mode in FIG. 5 is that the fill material (such as W, Cu, etc.) of the contact/via structure ends up attaching to underlying structure 504—rather than 502 to 504. Such a result causes failures when underlying structure 504 is a polysilicon bitline by shorting to the bitline, coupling capacitance increase, filling/reliability issues due to poor adhesion of the fill material to underlying structure 504 instead of the dielectric material 502, etc.

Figure 6:
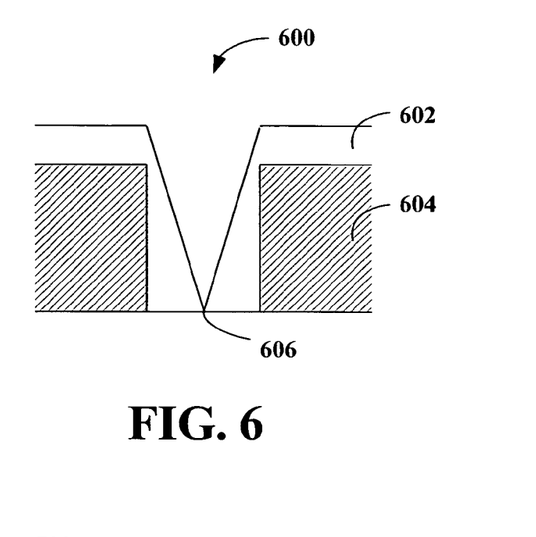
FIG. 6 is an illustration of a tapered contact hole exhibiting detrimental DICD variation.

FIG. 6 illustrates a cross-sectional view of a tapered contact via 600 that displays a bottom CD 606 that is substantially below a target tolerance (as illustrated, the contact hole is occluded due to the undesirably small bottom CD 606). Such a condition can arise if a fixed taper is employed when DICD at the top of the contact hole in a dielectric layer 602 overlaying an underlying structure 604 is smaller than desired, and is often referred to as a "pinched contact."

Figure 7:
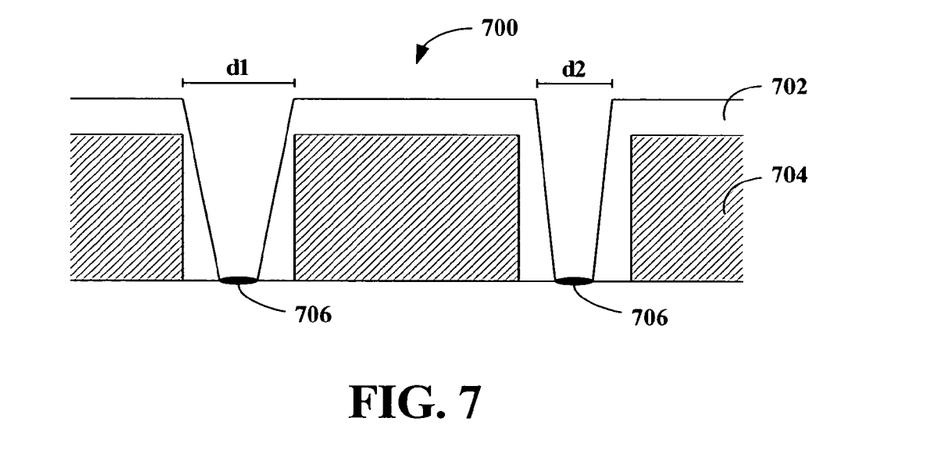
FIG. 7 is an illustration of tapered contact vias exhibiting controlled bottom CD despite DICD variation.

FIG. 7 illustrates a cross-section of two tapered vias on a wafer 700 wherein the tapers have been adjusted by a bottom CD control system. According to the figure, a dielectric layer 702 overlays an underlying structure 704. It will be noted that each of the vias on the wafer 700 exhibit DICDs that deviate from a desired target DICD, thus impeding utilization of a fixed taper. The contact on the left exhibits a DICD, d1, which is larger than desired. Consequently, the slope of the taper down to the bottom of the contact must be decreased in order to achieve a desired target bottom CD 706. To decrease the slope of the taper, the ratio of horizontal etching component to vertical etching component can be increased. For instance, in a $CHF_3$, $CF_4$, Ar process, $CHF_3$ can be increased, or $CF_4$ can be decreased, which will result in a higher ratio of $CHF_3$ to $CF_4$. By increasing the ratio of horizontal etching component to vertical etching component, the slope of the taper can be reduced to ensure that the bottom CD of the tapered via is within a target tolerance despite the fact that the DICD at the top of the via is larger than desired.

Similarly, the contact on the right exhibits a DICD, d2, which is smaller than a target tolerance, such that a fixed taper is undesirable because it increases the potential for a punched contact occurrence. According to this example, the slope of the taper can be increased by decreasing the ratio of horizontal etching component to vertical etching component in an etching process. For instance, in a $CHF_3$, $CF_4$, Ar process, $CHF_3$ can be decreased, or $CF_4$ can be increased, which will result in a lower ratio of $CHF_3$ to $CF_4$. By decreasing the ratio of horizontal etching component to vertical etching component, the slope of the taper can be increased to ensure that the bottom CD of the tapered contact is within a target tolerance despite the fact that the DICD at the top of the contact is smaller than desired.

Figures 8, 9, 10:
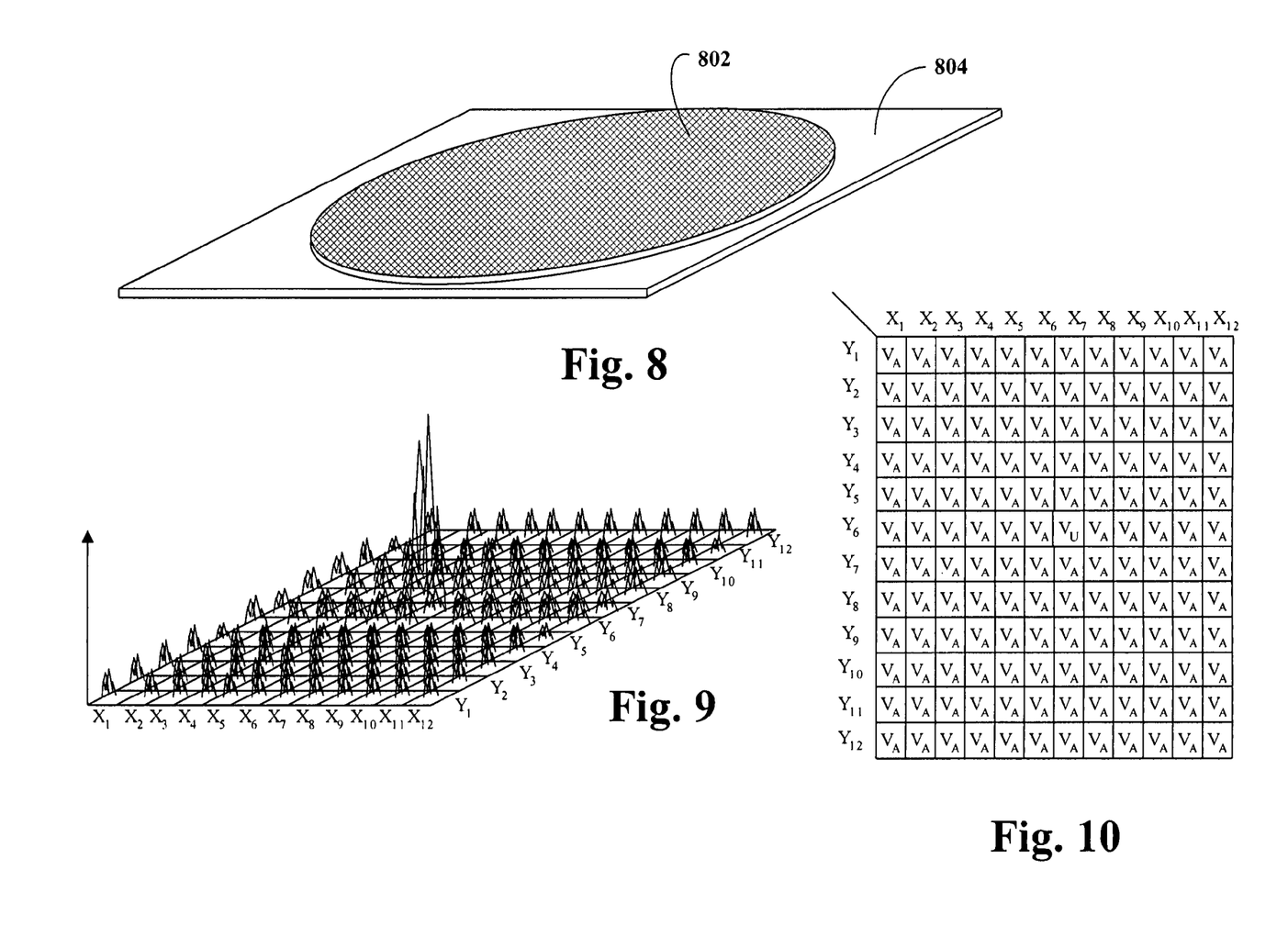
FIG. 8 illustrates a perspective view of a grid-mapped wafer according to one or more aspects of the present invention.
FIG. 9 illustrates plots of measurements taken at grid-mapped locations on a wafer in accordance with one or more aspects of the present invention.
FIG. 10 illustrates a table containing entries corresponding to measurements taken at respective grid-mapped locations on a wafer in accordance with one or more aspects of the present invention.

Turning now to FIGS. 8–10, in accordance with one or more aspects of the present invention, a wafer 802 (or one or more die located thereon) situated on a stage 804 can be logically partitioned into grid blocks to facilitate concurrent measurements of critical dimensions and overlay as the wafer matriculates through a semiconductor fabrication process. This can facilitate selectively determining to what extent, if any, fabrication adjustments are necessary. Obtaining such information can also assist in determining problem areas associated with fabrication processes.

FIG. 8 illustrates a perspective view of the steppable stage 804 supporting the wafer 802. The wafer 802 can be divided into a grid pattern as shown in FIG. 8. Each grid block (XY) of the grid pattern corresponds to a particular portion of the wafer 802 (e.g., a die or a portion of a die). The grid blocks are individually monitored for fabrication progress by concurrently measuring critical dimensions and overlay with either scatterometry or scanning electron microscope (SEM) techniques.

This can also be applicable in order to assess wafer-to-wafer and lot-to-lot variations. For example, a portion P (not shown) of a first wafer (not shown) can be compared to the corresponding portion P (not shown) of a second wafer. Thus, deviations between wafers and lots can be determined in order to calculate adjustments to the fabrication components that are necessary to accommodate for the wafer-to-wafer and/or lot-to-lot variations.

In FIG. 9, one or more respective portions of the wafer 802 ($X_1Y_1 \ldots X_{12}, Y_{12}$) are concurrently monitored for critical dimensions and overlay utilizing either scatterometry or scanning electron microscope techniques. Exemplary measurements produced during fabrication for each grid block are illustrated as respective plots. The plots can, for example, be composite valuations of signatures of critical dimensions and overlay. Alternatively, critical dimensions and overlay values can be compared separately to their respective tolerance limits.

As can be seen, the measurement at coordinate $X_7Y_6$ yields a plot that is substantially higher than the measurement of the other portions XY. This can be indicative of overlay, overlay error, and/or one or more critical dimension(s) outside of acceptable tolerances. As such, fabrication components and/or operating parameters associated therewith can be adjusted accordingly to mitigate repetition of this aberrational measurement. It is to be appreciated that the wafer 802 and or one or more die located thereon can be mapped into any suitable number and/or arrangement of grid blocks to effectuate desired monitoring and control.

FIG. 10 is a representative table of concurrently measured critical dimensions and overlay taken at various portions of the wafer 802 mapped to respective grid blocks. The measurements in the table can, for example, be amalgams of respective critical dimension and overlay signatures. As can be seen, all the grid blocks, except grid block $X_7Y_6$, have measurement values corresponding to an acceptable value ($V_A$) (e.g., no overlay error is indicated and/or overlay measurements and critical dimensions are within acceptable tolerances), while grid block $X_7Y_6$ has an undesired value ($V_U$) (e.g., overlay and critical dimensions are not within acceptable tolerances, thus at least an overlay or CD error exists). Thus, it has been determined that an undesirable fabrication condition exists at the portion of the wafer 802 mapped by grid block $X_7Y_6$. Accordingly, fabrication process components and parameters can be adjusted as described herein to adapt the fabrication process accordingly to mitigate the re-occurrence or exaggeration of this unacceptable condition.

Alternatively, a sufficient number of grid blocks can have desirable thickness measurements so that the single offensive grid block does not warrant scrapping the entire wafer. It is to be appreciated that fabrication process parameters can be adapted so as to maintain, increase, decrease and/or qualitatively change the fabrication of the respective portions of the wafer 802 as desired. For example, when the fabrication process has reached a pre-determined threshold level (e.g., X % of grid blocks have acceptable CDs and no overlay error exists), a fabrication step can be terminated.

Figure 11:
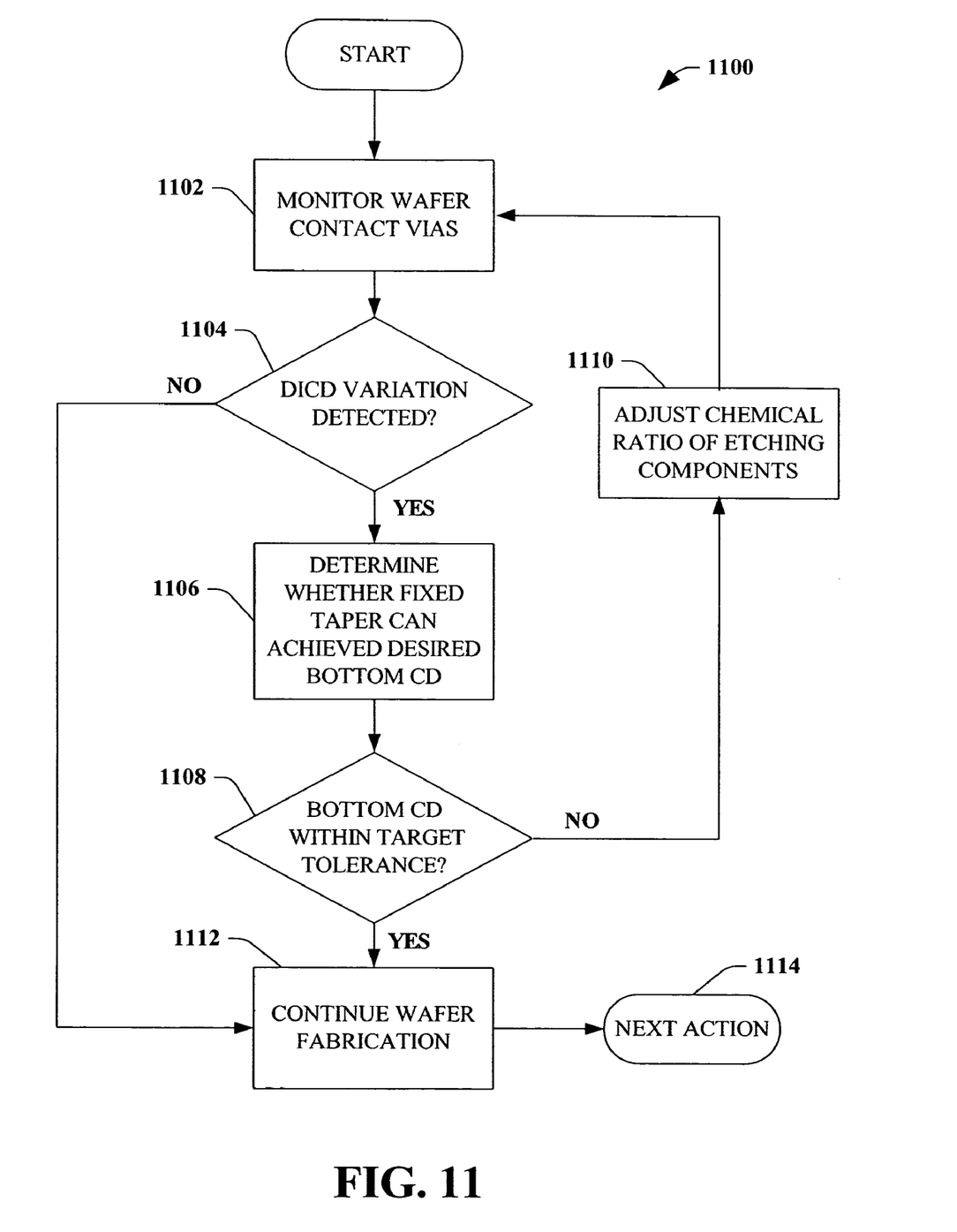
FIG. 11 is an illustration of a methodology that improves control of bottom CD in tapered contact vias in accordance with an aspect of the present invention.
Figure 12:
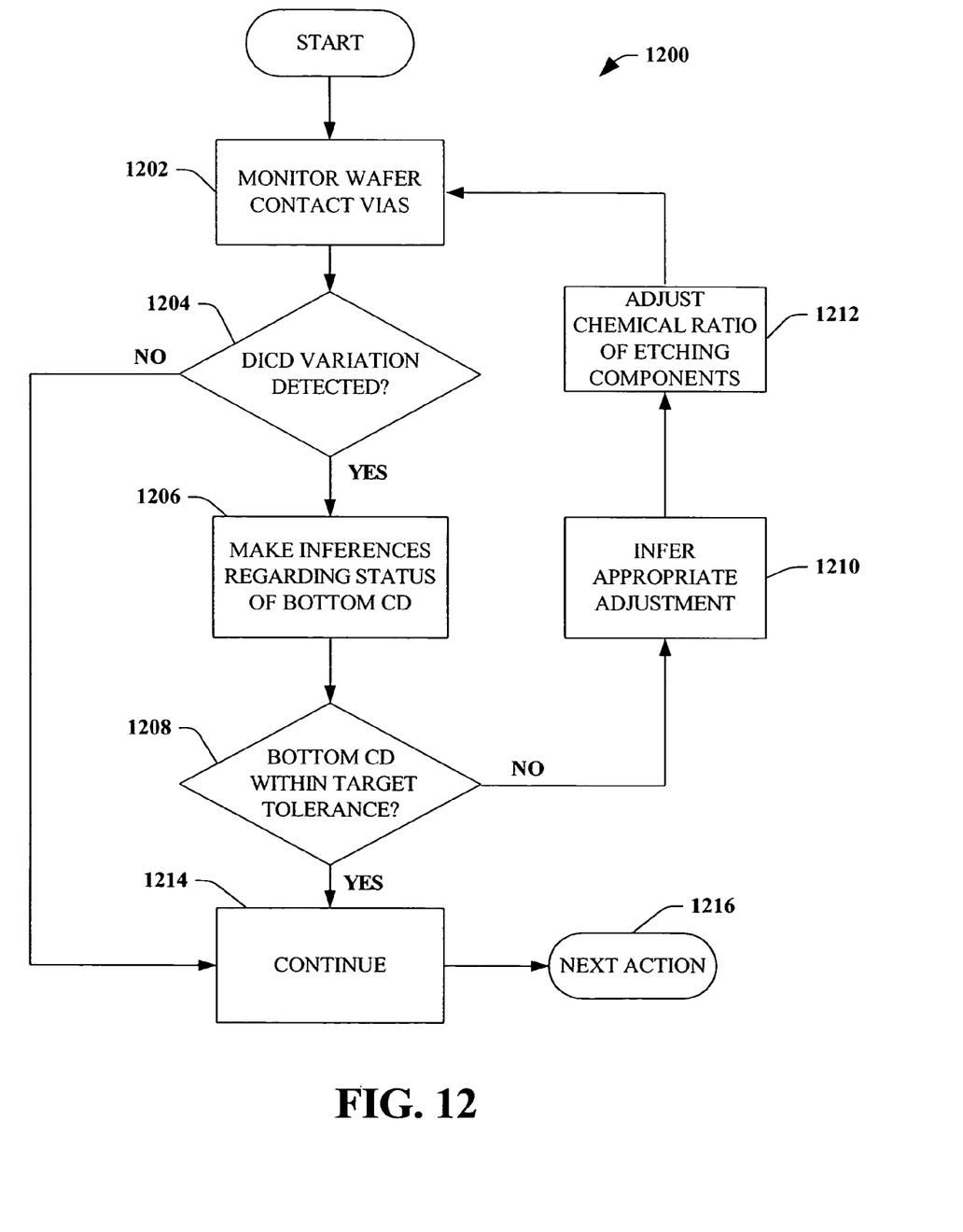
FIG. 12 is an illustration of a methodology that improves control of bottom CD in tapered contact vias in accordance with an aspect of the present invention.
Figure 13:
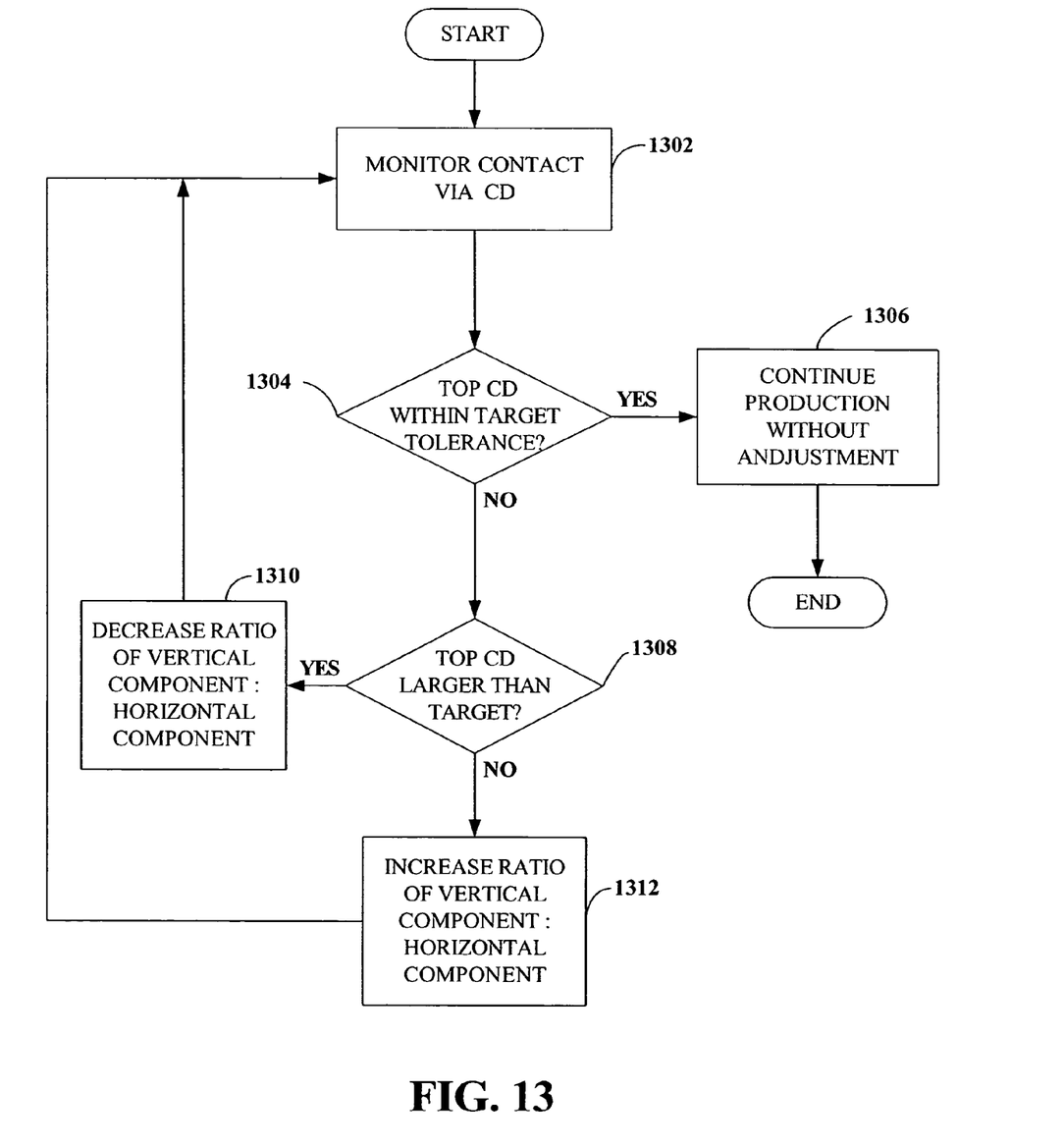
FIG. 13 is an illustration of a methodology that improves control of bottom CD in tapered contact vias in accordance with an aspect of the present invention.

Turning briefly to FIGS. 11, 12, and 13, methodologies that can be implemented in accordance with the present invention are illustrated. While, for purposes of simplicity of explanation, the methodologies are shown and described as a series of blocks, it is to be understood and appreciated that the present invention is not limited by the order of the blocks, as some blocks can, in accordance with the present invention, occur in different orders and/or concurrently with other blocks from that shown and described herein. Moreover, not all illustrated blocks may be required to implement the methodologies in accordance with the present invention.

FIG. 11 is an illustration of a methodology 1100 in accordance with an aspect of the present invention. At 1102, a wafer is monitored during an etching process. At 1104, a determination is made regarding whether a via exhibits a DICD outside of a target tolerance. If the DICD of vias on the wafer is within target tolerance, then the fixed taper selected for the contact will result in a bottom CD that is within a desired target tolerance and the method can proceed to 1112, where wafer fabrication can continue. If DICD variation is detected, then a determination is made at 1106 regarding whether bottom CD is or will be adversely affected by the deviation in DICD. Such determination can be made via assessment of whether DICD variation is so substantially outside of desired target tolerances that the taper to be created via the present ratio of horizontal etching component to vertical etching component will not provide the desired bottom CD in the via.

If it is determined that DICD will be unsatisfactory (e.g., outside target tolerances), then a determination is made at 1108 as to whether bottom CD will be unsatisfactory (e.g., outside target bottom CD tolerances). If the target bottom CD can be achieved despite DICD variation, then the method can proceed to 1112, where wafer fabrication can continue without adjustment of via taper. If not, then the method can proceed to 1110, where horizontal etching component to vertical etching component ratios can be adjusted to increase or decrease the slope of tapered contacts on the next wafer.

The particular etching process being controlled by the present invention can be employed using a 1:1 ratio of polymer to gas to facilitate a predetermination of a standard taper associated with the process. Nevertheless, it is noted that the 1:1 ratio is only a typical ratio of $CHF_3/CF_4$ and the standard taper may be obtained with a different ratio such as 0.5:1 or 2:1 depending on the particular stack thickness/material/etch tool etc. Also, the ratio of polymerizing gas to etchant gas to obtain the same standard taper can change if alternate chemistries used, such as $C_4F_8/CF_4/CO/Ar$, $C_5F_8/CF_4/Ar$, or $C_4F_6/CF_4/Ar$, (or variants thereof) are used instead. This standard taper can provide information to facilitate decisions regarding the amounts by which vertical and/or horizontal etching component concentrations can be altered to adjust the slope of the taper.

FIG. 12 illustrates a methodology 1200 for advance process control of bottom CD in tapered contact vias on a wafer. At 1202 a tapered vias on a wafer are monitored, utilizing, for example, a scatterometry component. At 1204, a determination is made regarding deviation from target DICD at the top of tapered vias. If it is determined that top CD is within target tolerances, then the method can proceed to 1214, where wafer fabrication can continue. If, however, top CD deviates substantially from target, then at 1206, inferences can be made regarding whether bottom CD is within target tolerances. Such inferences can be based at least in part, for example, on present etchant component ratios, temperature of the wafer and/or etching environment, solubility of the resist, etc., or on any other suitable wafer parameter that can potentially affect the taper of the via during etching. At 1208, a determination of via bottom CD status is made based at least in part on the inferences made at 1206. If the inferences indicate that bottom CD is still within target tolerances despite top CD variation, then the method can proceed to 1214 for continued wafer fabrication. If, at 1208, bottom CD of tapered vias is determined to be potentially adversely affected, then at 1210, inferences can be made regarding an appropriate adjustment to ratios of horizontal etching components to vertical etching components, in order to increase or decrease the taper of the contacts on the next wafer. At 1212, the ratios of the chemical etching components can be adjusted to alter the taper of the vias on the wafers. The method can then revert to 1202 for continued monitoring of tapered vias on a subsequent wafer. In this manner, the present invention can recognize appreciable cost savings by enhancing advance process control of wafers and mitigating the number of wafers produced with tapered vias exhibiting unacceptable bottom CD.

FIG. 13 is an illustration of a methodology wherein etching component ratios are altered to adjust the slope of tapered vias on a wafer in order to improve advance process control in wafer manufacture and increase cost saving associated therewith. At 1302, wafer contacts are monitored via, for example, a scatterometry system. At 1304, a determination is made based on information obtained during monitoring of the vias regarding whether the top CD (e.g., post-develop inspection CD, or DICD) of a via is within desired target tolerances. If the top CD is within desired tolerance, then the method can proceed to 1306, where wafer fabrication can continue without adjustment of the etching components, thus saving costs associated with mitigating undesirable bottom CD. If top CD is not within a target tolerance, then at 1308, a determination is made regarding whether the top CD is above or below the desired CD tolerance. If it is determined that the top CD is above target, then the ratio of horizontal etching component to vertical etching component can be increased at 1310 to decrease the slope of the taper of the vias, which in turn facilitates achievement of the desired bottom CD.

For example, to decrease the slope of the taper, the ratio of horizontal etching component to vertical etching component can be increased. For instance, in a $CHF_3$, $CF_4$, Ar process, $CHF_3$ can be increased, or $CF_4$ can be decreased, which will result in a higher ratio of $CHF_3$ to $CF_4$. By increasing the ratio of horizontal etching component to vertical etching component, the slope of the taper can be reduced to ensure that the bottom CD of the tapered via is within a target tolerance despite the fact that the DICD at the top of the via is larger than desired. The method can then revert to 1302 for continued monitoring of subsequent wafers.

If the top CD is smaller than a desired target tolerance as determined at 1308, the slope of the taper can be increased to ensure that bottom CD is within target tolerances by decreasing the ratio of horizontal etching component to vertical etching component in the etching process at 1312. For instance, in a $CHF_3$, $CF_4$, Ar process, $CHF_3$ can be decreased, or $CF_4$ can be increased, which will result in a lower ratio of $CHF_3$ to $CF_4$. By decreasing the ratio of horizontal etching component to vertical etching component, the slope of the taper can be increased to ensure that the bottom CD of the tapered via is within a target tolerance despite the fact that the DICD at the top of the via is smaller than desired. The method can then revert to 1302 for continued monitoring of subsequent wafers.

It is to be appreciated that the invention is not limited to a $CHF_3$, $CF_4$, Ar process, but rather can selectively adjust etchant component ratios of any suitable etching process. For example, in a $C_4F_8$, CO, $CF_4$, Ar process, the ratio of $C_4F_8$ to $CF_4$ can be increased to increase the taper (e.g., decrease the slope) of the contact. Similarly, the ratio of $C_4F_8$ to $CF_4$ can be decreased to decrease the taper (e.g., increase the slope) of the contact. In this manner, an etching process can be varied to enhance advance process control of wafer fabrication.

Figure 14:
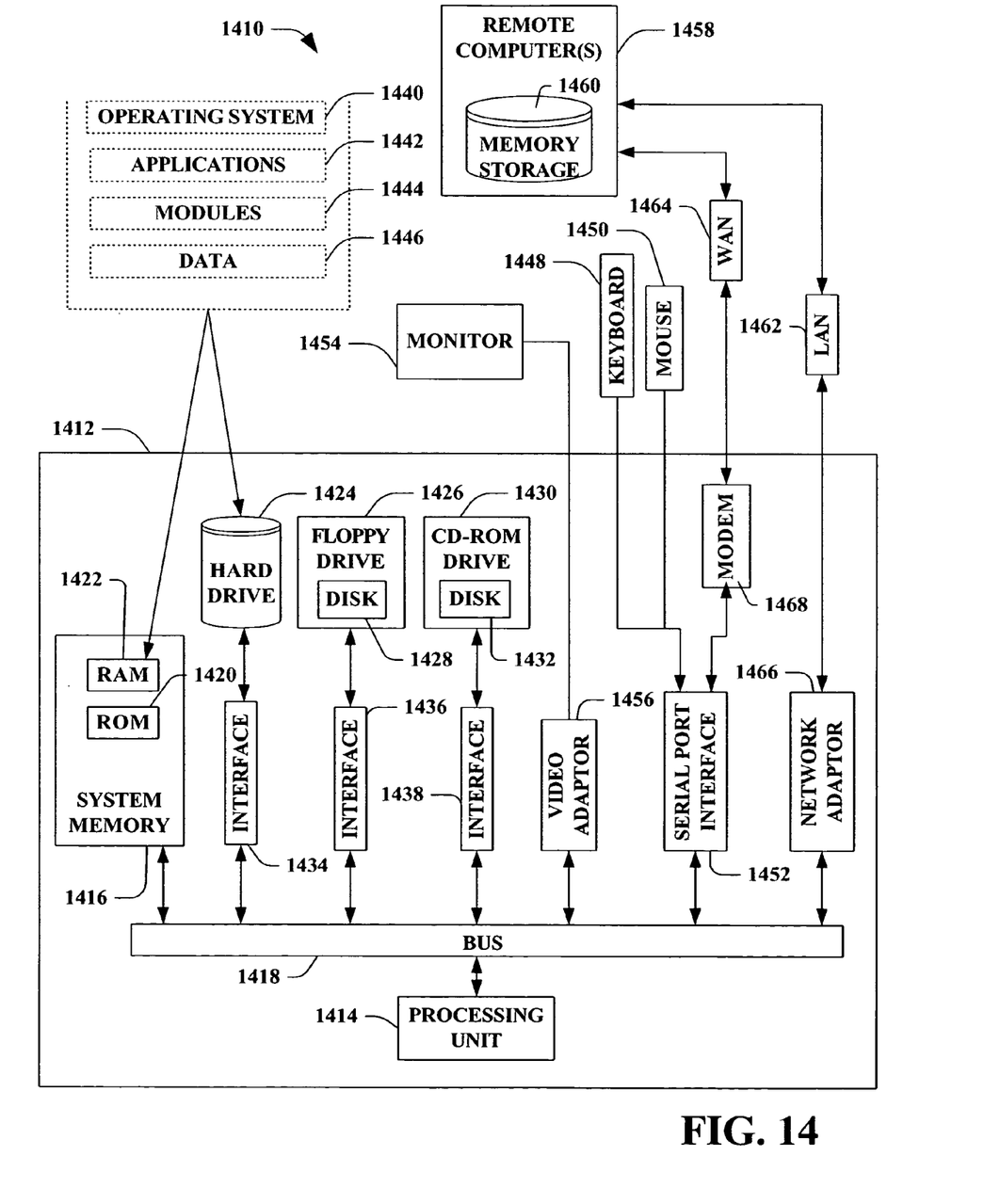
FIGS. 14 and 15 are illustrations of exemplary computing systems and/or environments in connection with facilitating employment of the subject invention.
Figure 15:
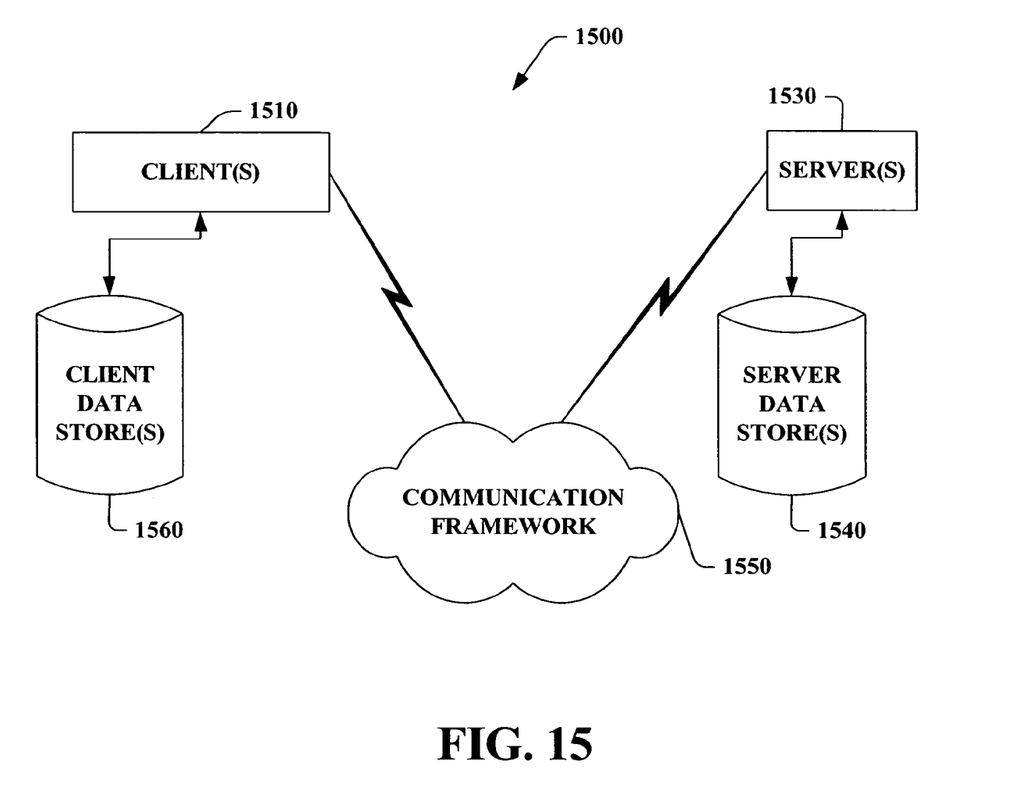

In order to provide a context for the various aspects of the invention, FIGS. 14 and 15 as well as the following discussion are intended to provide a brief, general description of a suitable computing environment in which the various aspects of the present invention can be implemented. While the invention has been described above in the general context of computer-executable instructions of a computer program that runs on a computer and/or computers, those skilled in the art will recognize that the invention also can be implemented in combination with other program modules. Generally, program modules include routines, programs, components, data structures, etc. that perform particular tasks and/or implement particular abstract data types. Moreover, those skilled in the art will appreciate that the inventive methods can be practiced with other computer system configurations, including single-processor or multiprocessor computer systems, mini-computing devices, mainframe computers, as well as personal computers, hand-held computing devices, microprocessor-based or programmable consumer electronics, and the like. The illustrated aspects of the invention can also be practiced in distributed computing environments where tasks are performed by remote processing devices that are linked through a communications network. However, some, if not all, aspects of the invention can be practiced on stand-alone computers. In a distributed computing environment, program modules can be located in both local and remote memory storage devices.

With reference to FIG. 14, an exemplary environment 1410 for implementing various aspects of the invention includes a computer 1412. The computer 1412 includes a processing unit 1414, a system memory 1416, and a system bus 1418. The system bus 1418 couples system components including, but not limited to, the system memory 1416 to the processing unit 1414. The processing unit 1414 can be any of various available processors. Dual microprocessors and other multiprocessor architectures also can be employed as the processing unit 1414.

The system bus 1418 can be any of several types of bus structure(s) including the memory bus or memory controller, a peripheral bus or external bus, and/or a local bus utilizing any variety of available bus architectures including, but not limited to, 8-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), and Small Computer Systems Interface (SCSI).

The system memory 1416 includes volatile memory 1420 and nonvolatile memory 1422. The basic input/output system (BIOS), comprising the basic routines to transfer information between elements within the computer 1412, such as during start-up, is stored in nonvolatile memory 1422. By way of illustration, and not limitation, nonvolatile memory 1422 can include read only memory (ROM), programmable ROM (PROM), electrically programmable ROM (EPROM), electrically erasable ROM (EEPROM), or flash memory. Volatile memory 1420 includes random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM).

Computer 1412 also includes removable/non-removable, volatile/non-volatile computer storage media. FIG. 14 illustrates, for example, a disk storage 1424. Disk storage 1424 includes, but is not limited to, devices like a magnetic disk drive, floppy disk drive, tape drive, Jaz drive, Zip drive, LS-100 drive, flash memory card, or memory stick. In addition, disk storage 1424 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1424 to the system bus 1418, a removable or non-removable interface is typically used such as interface 1426.

It is to be appreciated that FIG. 14 describes software that acts as an intermediary between users and the basic computer resources described in suitable operating environment 1410. Such software includes an operating system 1428. Operating system 1428, which can be stored on disk storage 1424, acts to control and allocate resources of the computer system 1412. System applications 1430 take advantage of the management of resources by operating system 1428 through program modules 1432 and program data 1434 stored either in system memory 1416 or on disk storage 1424. It is to be appreciated that the present invention can be implemented with various operating systems or combinations of operating systems.

A user enters commands or information into the computer 1412 through input device(s) 1436. Input devices 1436 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1414 through the system bus 1418 via interface port(s) 1438. Interface port(s) 1438 include, for example, a serial port, a parallel port, a game port, and a universal serial bus (USB). Output device(s) 1440 use some of the same type of ports as input device(s) 1436. Thus, for example, a USB port can be used to provide input to computer 1412, and to output information from computer 1412 to an output device 1440. Output adapter 1442 is provided to illustrate that there are some output devices 1440 like monitors, speakers, and printers, among other output devices 1440, which require special adapters. The output adapters 1442 include, by way of illustration and not limitation, video and sound cards that provide a means of connection between the output device 1440 and the system bus 1418. It should be noted that other devices and/or systems of devices provide both input and output capabilities such as remote computer(s) 1444.

Computer 1412 can operate in a networked environment utilizing logical connections to one or more remote computers, such as remote computer(s) 1444. The remote computer(s) 1444 can be a personal computer, a server, a router, a network PC, a workstation, a microprocessor based appliance, a peer device or other common network node and the like, and typically includes many or all of the elements described relative to computer 1412. For purposes of brevity, only a memory storage device 1446 is illustrated with remote computer(s) 1444. Remote computer(s) 1444 is logically connected to computer 1412 through a network interface 1448 and then physically connected via communication connection 1450. Network interface 1448 encompasses communication networks such as local-area networks (LAN) and wide-area networks (WAN). LAN technologies include Fiber Distributed Data Interface (FDDI), Copper Distributed Data Interface (CDDI), Ethernet/IEEE 802.3, Token Ring/IEEE 802.5 and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1450 refers to the hardware/software employed to connect the network interface 1448 to the bus 1418. While communication connection 1450 is shown for illustrative clarity inside computer 1412, it can also be external to computer 1412. The hardware/software necessary for connection to the network interface 1448 includes, for exemplary purposes only, internal and external technologies such as, modems including regular telephone grade modems, cable modems and DSL modems, ISDN adapters, and Ethernet cards.

FIG. 15 is a schematic block diagram of a sample-computing environment 1500 with which the present invention can interact. The system 1500 includes one or more client(s) 1510. The client(s) 1510 can be hardware and/or software (e.g., threads, processes, computing devices). The system 1500 also includes one or more server(s) 1530. The server(s) 1530 can also be hardware and/or software (e.g., threads, processes, computing devices). The servers 1530 can house threads to perform transformations by employing the present invention, for example. One possible communication between a client 1510 and a server 1530 can be in the form of a data packet adapted to be transmitted between two or more computer processes. The system 1500 includes a communication framework 1550 that can be employed to facilitate communications between the client(s) 1510 and the server(s) 1530. The client(s) 1510 are operably connected to one or more client data store(s) 1560 that can be employed to store information local to the client(s) 1510. Similarly, the server(s) 1530 are operably connected to one or more server data store(s) 1540 that can be employed to store information local to the servers 1530.

What has been described above comprises examples of the present invention. It is, of course, not possible to describe every conceivable combination of components or methodologies for purposes of describing the present invention, but one of ordinary skill in the art can recognize that many further combinations and permutations of the present invention are possible. Accordingly, the present invention is intended to embrace all such alterations, modifications and variations that fall within the spirit and scope of the appended claims. Furthermore, to the extent that the term "comprises" is used in either the detailed description or the claims, such term is intended to be inclusive in a manner similar to the term "comprising " as "comprising " is interpreted when employed as a transitional word in a claim.

What is claimed is:

1. A method for controlling bottom critical dimension variation in a tapered contact on a semiconductor substrate, the tapered contact via having a top portion and a bottom portion, comprising:
   monitoring tapered contact vias on a wafer to detect variations in critical dimension at the top portion of the tapered contact via; and
   selectively altering etchant component ratios of a horizontal etching component and a vertical etching component in an etching process based on the variations in critical dimension at the top portion to control critical dimension at the bottom portion within a target tolerance.

2. The method of claim 1, further comprising employing the etching process at a 1:1 ratio of horizontal etching component to vertical etching component to determine a standard slope of the etching process.

3. The method of claim 1, further comprising increasing the ratio of horizontal etching component to vertical etching component in the etching process to decrease a slope of the tapered contact.

4. The method of claim 3, the etching components comprise $CHF_3$, $CF_4$, and Ar, where $CHF_3$ is the horizontal etching component and $CF_4$ is the vertical etching component.

5. The method of claim 3, etching components comprise $C_4F_8$, CO, $CF_4$, and Ar, where $C_4F_8$ is the horizontal etching component and $CF_4$ is the vertical etching component.

6. The method of claim 1, wherein altering etching component ratios comprises increasing the ratio of horizontal etching component to vertical etching component.

7. The method of claim 6, the etching components comprise $CHF_3$, $CF_4$, and Ar, where $CHF_3$ is the horizontal etching component and $CF_4$ the horizontal etching component.

8. The method of claim 6, the etching components comprise $C_4F_8$, CO, $CF_4$, and Ar etching process, where $C_4F_8$ is the horizontal etching component and $CF_4$ is the vertical etching component.

9. The method of claim 1, further comprising employing feed-forward/feedback loops to accurately vary etching component ratios.

10. The method of claim 1, further comprising applying the altered etching process to subsequent wafers in a wafer fabrication line to mitigate the occurrence of undesired critical dimension.

11. A method for controlling bottom critical dimension variation in a tapered contact on a semiconductor substrate or improving critical dimension control in a bottom portion of tapered contact vias on the semiconductor substrate, comprising:
   monitoring variations in critical dimension at a top portion of tapered contact vias on a wafer; and
   selectively modifying etchant component ratios of horizontal etching component to vertical etching component in an etching processes based upon the variations in critical dimension at the top portion of the tapered contact vias to adjust critical dimension at the bottom portion.

12. The method of claim 11, further comprising increasing a slope of the tapered contact vias by increasing the ratio of horizontal etching component to vertical etching component.

13. The method of claim 11, further comprising decreasing a slope of the tapered contact vias by decreasing the ratio of horizontal etching component to vertical etching component.

14. The method of claim 11, further comprising identifying a standard slope of the tapered contact vias.

* * * * *